(12) United States Patent
Su et al.

(10) Patent No.: US 8,419,953 B1
(45) Date of Patent: Apr. 16, 2013

(54) METHOD AND SYSTEM FOR REMOVING AN ANTIFERROMAGNETIC SEED STRUCTURE

(75) Inventors: Wencheng Su, Cupertino, CA (US); Zhigang Zhou, San Ramon, CA (US); Jane Ang, San Jose, CA (US); Ming Jiang, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 106 days.

(21) Appl. No.: 13/170,491

(22) Filed: Jun. 28, 2011

(51) Int. Cl.
  *B44C 1/22* (2006.01)
(52) U.S. Cl.
  USPC ............. 216/22; 216/95; 216/103; 438/750
(58) Field of Classification Search ............ 216/22, 216/23, 40, 95, 100, 103, 108; 438/735, 438/745, 754, 757
  See application file for complete search history.

(56) References Cited

U.S. PATENT DOCUMENTS

| 6,143,192 | A | 11/2000 | Westmoreland | |
|---|---|---|---|---|
| 6,454,957 | B1 | 9/2002 | Westmoreland | |
| 6,537,462 | B1 | 3/2003 | Westmoreland | |
| 6,696,338 | B2 | 2/2004 | Oh et al. | |
| 6,699,769 | B2 | 3/2004 | Song et al. | |
| 7,211,447 | B2 | 5/2007 | Horng et al. | |
| 7,264,742 | B2 | 9/2007 | Westmoreland | |
| 2005/0102821 | A1* | 5/2005 | Kagami et al. | 29/603.12 |
| 2006/0204794 | A1* | 9/2006 | Kikuchi et al. | 428/836.2 |
| 2008/0156664 | A1 | 7/2008 | O'Sullivan et al. | |
| 2009/0078676 | A1 | 3/2009 | Yamada et al. | |
| 2010/0022030 | A1* | 1/2010 | Ditizio | 438/3 |
| 2010/0270710 | A1* | 10/2010 | Kang et al. | 264/427 |

\* cited by examiner

*Primary Examiner* — Lan Vinh

(57) ABSTRACT

A method for fabricating a transducer on a substrate is described. The transducer includes an antiferromagnetic seed structure. The antiferromagnetic seed structure includes a first NiFe layer, a first multilayer including a first Ru layer, a second NiFe layer, and a second multilayer including a second Ru layer. The second multilayer, the second NiFe layer and part of the first Ru layer are removed using a first wet etch, which uses a first etchant combination to remove NiFe and in which Ru is insoluble. The second Ru layer is removed through lift-off due to etching of the second NiFe layer. A remainder of the first Ru layer is removed through a second wet etch, which uses a second etchant combination to remove Ru. A remaining portion of the first multilayer and the first NiFe layer are removed through a third etch, which uses a third etchant combination that removes NiFe.

18 Claims, 5 Drawing Sheets

METHOD AND SYSTEM FOR REMOVING AN ANTIFERROMAGNETIC SEED STRUCTURE

BACKGROUND

Antiferromagnetic (AFM) seed layers may be used in fabrication of magnetic recording transducers. FIG. 1 depicts one such conventional AFM seed structure 10. For simplicity, FIG. 1 is not to scale. The AFM seed structure 10 includes a first NiFe layer 12, a first multilayer 20, a second NiFe layer 30, and a second multilayer 40. The first multilayer 20 includes a first Ru layer 24 sandwiched between a first CoFe layer 22 and a second CoFe layer 26. The second multilayer 40 includes a second Ru layer 44 sandwiched between an IrMn layer 42 and a third NiFe layer 46. When the conventional AFM seed structure 10 is used as a seed structure for plated magnetic shield and/or pole materials, the resulting magnetic transducer may have improved performance.

FIG. 2 depicts a conventional method 50 for fabricating a magnetic recording transducer using a conventional AFM seed structure. For simplicity, steps may be omitted, combined, or include substeps. The AFM seed structure 10 is deposited, and the magnetic material plated in the desired portions of the device and field regions, via step 52. Exposed portions of the AFM seed structure are removed, via step 54. The device region is then masked, via step 56. Thus, the structures formed in the device region are protected during subsequent steps. However, the remaining magnetic materials and AFM seed structures are desired to be removed from, for example, the field regions. A single conventional wet etch is thus performed to remove both the magnetic materials and the AFM seed structure 10, via step 58. Fabrication of the magnetic transducer may then be completed.

Although such conventional methods may be used, the single wet etch is usually unable to adequately remove the AFM seed structure 10. The single wet etch is typically configured to remove magnetic materials such as CoFe, NiFe, and CoNiFe. For example, an HCl bath might be used to remove oxide on the AFM seed structure, followed by a bath having a mixture of sulfuric acid, HCl, and hydrogen peroxide. This wet etch is capable of removing the magnetic materials, but only partially removes the AFM seed structure 10. Various layers of the AFM seed structure 10 are not soluble in the etchants used. For example, Ru is not soluble in such an etch bath. Further, IrMn is only partially soluble in these etchants. As a result, portions of the AFM seed 10 may remain after step 58 is performed. These portions may adversely affect operation of the magnetic transducer. Consequently, performance of the transducer may be adversely affected.

Accordingly, what is needed is a system and method for improving fabrication of a magnetic transducer.

BRIEF SUMMARY OF THE INVENTION

A method for fabricating a transducer on a substrate having a device region and a field region is described. In some aspects, the device region and the field region each include an antiferromagnetic seed structure and magnetic materials residing on the antiferromagnetic seed structure. The antiferromagnetic seed structure includes a first NiFe layer, a first multilayer including a first Ru layer, a second NiFe layer, and a second multilayer including a second Ru layer. The second multilayer is on the second NiFe layer. The first multilayer is between the first NiFe layer and the second NiFe layer. The method includes removing at least the second multilayer, the second NiFe layer and at least a portion of the first Ru layer using a first wet etch process. The first wet etch process uses a first etchant combination configured to remove at least NiFe and in which Ru is insoluble. At least the second Ru layer is removed through lift-off due to etching of the second NiFe layer. A remaining portion of the first Ru layer is removed using a second wet etch process. The second wet etch process uses a second etchant combination configured to remove Ru. A remaining portion of the first multilayer and the first NiFe layer are removed using a third etch process. The third etch process uses a third etchant combination configured to remove at least the NiFe.

DETAILED DESCRIPTION OF THE PREFERRED EMBODIMENTS

Figure 3:
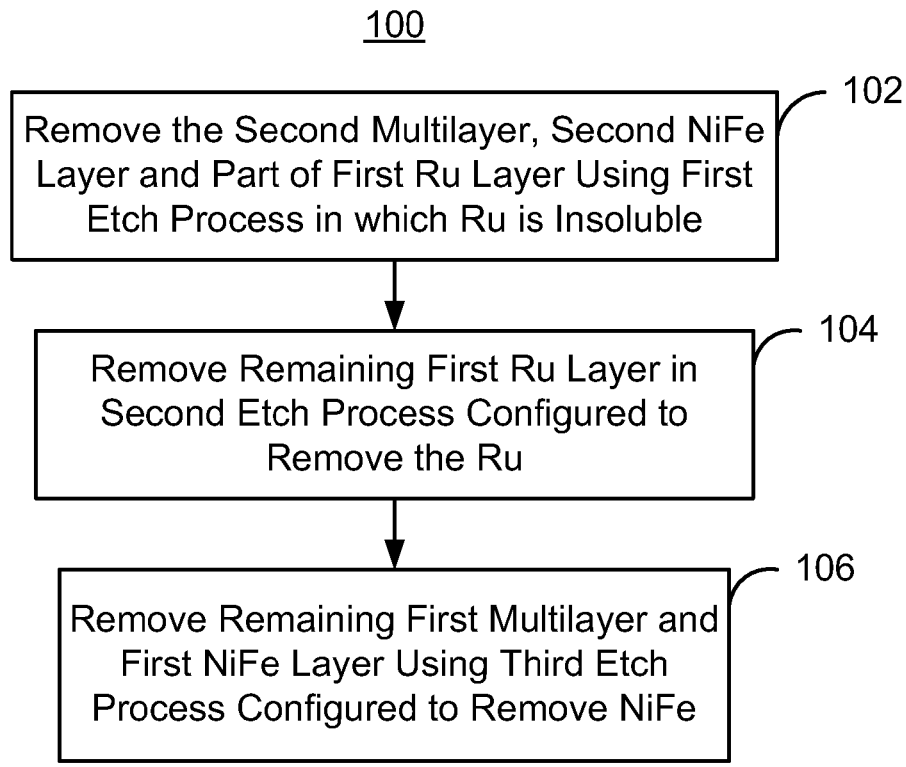
FIG. 3 depicts an exemplary embodiment of a method for removing an antiferromagnetic seed structure.

FIG. 3 depicts an exemplary embodiment of a method 100 for removing an antiferromagnetic (AFM) seed structure that has been used in fabricating a portion of a magnetic transducer. For simplicity, some steps may be omitted, combined, and/or interleaved. The method 100 also may commence after formation of other structures of the read and/or write transducer. FIGS. 4-7 depict an exemplary embodiment of an AFM seed structure 110 removed using the method 100. For clarity, FIGS. 4-7 are not to scale. The method 100 is also described in the context of the AFM seed structure 110 depicted in FIGS. 4-7. The AFM seed structure 110 may be used in a transducer. However, the method 100 may be used to fabricate multiple structures and/or transducer at substantially the same time. The method 100 and AFM seed structure 110 are also described in the context of particular layers. However, in some embodiments, such layers may include sub-layer(s).

Figure 1:
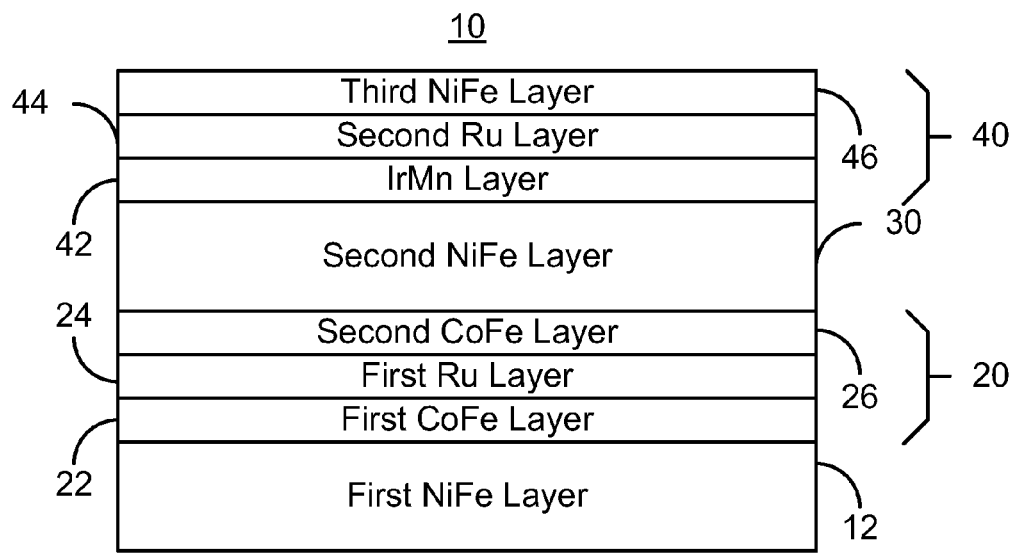
FIG. 1 is a diagram of a portion of an antiferromagnetic seed structure.
Figure 2:
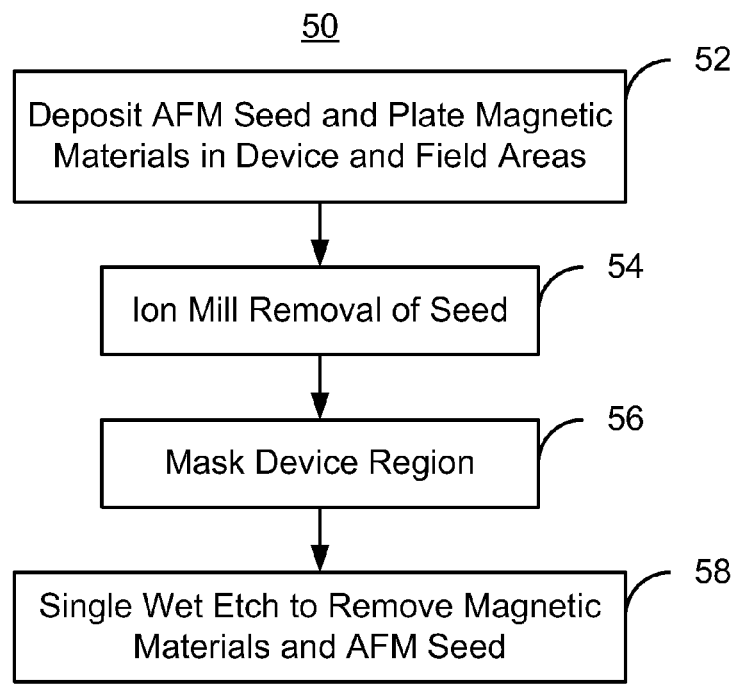
FIG. 2 depicts conventional method for fabricating a magnetic transducer using an antiferromagnetic seed structure.
Figure 4:
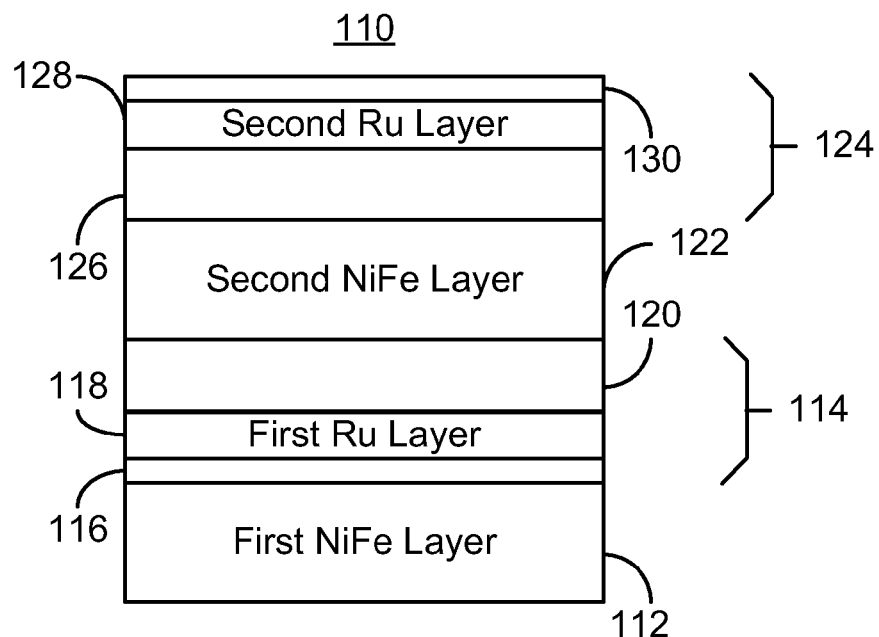
FIGS. 4-7 depict an exemplary embodiment of an antiferromagnetic seed structure.

FIG. 4 depicts the AFM seed structure 110 before the method 100 starts. The AFM seed structure 110 includes a number of layers. The AFM seed structure 110 includes a first NiFe layer 112, a first multilayer 114, a second NiFe layer 122, and a third multilayer 124. The first multilayer includes a first Ru layer 118 and may include other layers 116 and 120. In some embodiments, layers 116 and 120 are two CoFe layers 116 and 120 that sandwich the first Ru layer 118. The second multilayer 124 includes at least a second Ru layer 128. The second multilayer may also include other layers 128 and 132. In some embodiments, layers 128 and 132 are an IrMn layer 128 and a third NiFe layer 132, respectively. Thus, in some embodiments, the AFM seed structure 110 is the same as the AFM seed structure 10 depicted in FIG. 1. In the embodiment shown, the Ru layers 118 and 128 are sandwiched by the layers 116 and 120 and 126 and 130, respectively. However, in other embodiments, the Ru layers 118 and 128 may be located elsewhere in the multilayers 114 and 124. Further, other embodiments may include fewer or additional layers (not shown). In some embodiments, one or more magnetic layers or another structure may reside on the AFM seed structure 110.

At least the second multilayer 124, the second NiFe layer 122 and at least a portion of the first Ru layer 118 are removed using a first wet etch process, via step 102. The first wet etch process uses a first etchant combination that is configured to remove at least NiFe. In some embodiments, the removal process 100 is also desired to remove magnetic materials deposited on the AFM seed structure 110. In such embodiments, the first etchant combination removes not only the portions of the seed structure 110, but also the magnetic materials. For example, the first etchant combination may be configured to remove NiFe, CoNiFe, and CoFe. Ru is insoluble in the first etchant. Stated differently, the wet etch process does not remove the Ru by dissolving the Ru. Instead, at least the second Ru layer is removed through lift-off due to etching of the second NiFe layer. Further, other layers may be insoluble or only partially soluble in the first etchant. A material that is only partially soluble in an etch bath is only partially removed by being dissolved in the etchant. Such fully or partially insoluble materials may be removed by lift-off of the underlying layer, such as the NiFe layer.

The first etchant combination for the first wet etch process of step 102 includes one or more etch baths. Thus, the substrate including the AFM seed structure 110 is immersed in the etch bath(s). One or more of the etch baths may be combined with a lift-off mechanism. Further, the etch bath(s) may include one or more of sulfuric acid, hydrochloric acid, and hydrogen peroxide. In other embodiments, step 102 may be performed in another manner. However, step 102 uses a combination of the solubility of material(s) in the etch baths/solutions and lift-off of underlying layers to remove portions of the AFM seed structure 110.

In some embodiments, the first etchant combination of step 102 may include a first etch bath and a second etch bath. The first etch bath includes HCl and may be used to remove oxide from the surface of the transducer. In some embodiments, the first etch bath includes at least five and not more than fifteen volume percent HCl. In some such embodiments, the first etch bath includes at least nine and not more than eleven volume percent hydrochloric acid. The lift-off mechanism may be used in conjunction with the first etch bath. The second etch bath includes hydrochloric acid, sulfuric acid, and hydrogen peroxide. In some embodiments, the second etch bath includes at least three and not more than eleven volume percent hydrochloric acid, at least six and not more than fifteen volume percent sulfuric acid, and at least five and not more than fifteen volume percent hydrogen peroxide. In some such embodiments, the second etch bath includes at least five and not more than seven volume percent hydrochloric acid, at least ten and not more than twelve volume percent sulfuric acid, and at least nine and not more than eleven volume percent hydrogen peroxide. Further, the lift-off mechanism may be applied with the second etch bath. In some embodiments, the lift-off mechanism is applied with both etch baths. In other embodiments, the lift-off mechanism might be applied only with the first or only with the second etch baths. However, if the lift-off mechanism is only applied with one of the etch baths, then the lift off mechanism would be applied with the second etch bath.

The lift-off mechanism applied in step 102 is used to aid in lift-off of layers, particularly those which are insoluble or only partially soluble in the etch bath. For example, the lift-off mechanism of step 102 may assist in removal of the second Ru layer 128 and, in some embodiments, the IrMn layer 126 that are insoluble and partially soluble, respectively, in the second etch bath. The lift-off mechanism may include one or more of increasing a time in which the AFM structure 110 is immersed in the etch bath, agitating the etch bath, applying ultrasound to the etch bath, and using a high pressure spray to the AFM seed structure 110. For example, the time the AFM seed structure 110 is immersed in the etch bath may be at least two minutes. In some embodiments, the etch time may be three minutes or more. The lift-off mechanism may also include agitating the etch bath at an agitation speed of at least 15 mm/s. In some such embodiments, the agitation speed is at least 50 mm/s. In general, the lift-off mechanism is increased as the second NiFe layer 122 becomes thinner. For example, as the second NiFe layer 122 drops below three hundred Angstroms in thickness, the lift-off mechanism is increased. For example, both enhanced time and agitation speed may be used for such a NiFe layer 122.

Figure 5:
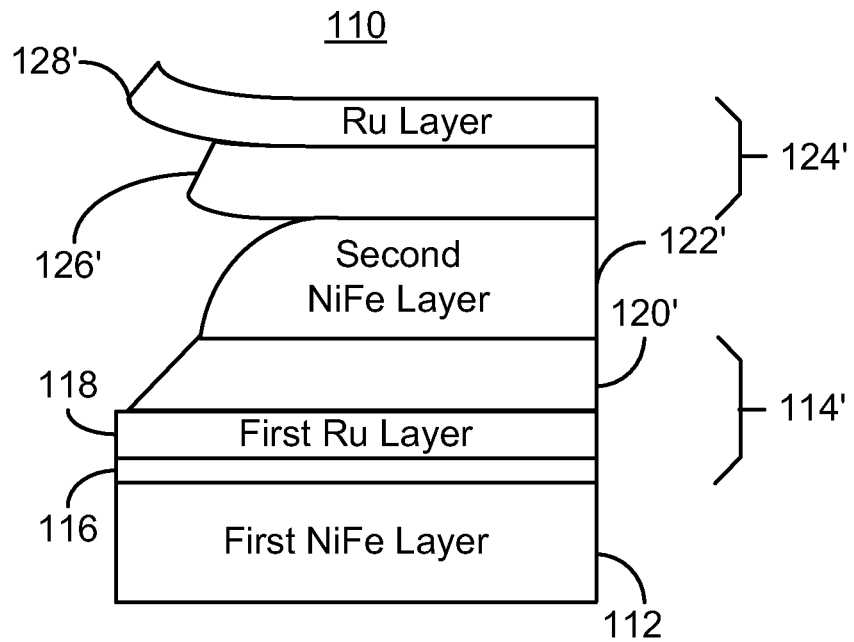

FIG. 5 depicts the AFM seed structure 110 during step 102. The AFM seed structure 110 is depicted during use of the first etchant combination. For example, the AFM seed structure 110 of FIG. 5 may be reside in the second etch bath under a desired agitation speed, but before the desired time in the second etch bath has elapsed. As can be seen in FIG. 5, a significant portion of the second NiFe layer 122' has been removed. The layer 130 of the second multilayer 124' has also been removed by the first etchant combination. In the embodiment shown, the layer 126' might be IrMn or other material that is partially soluble in the etch bath. Thus, a portion of the layer 126' has been removed by the solution. However, the Ru layer 128' is insoluble. Thus, the second Ru layer 128' and the remaining portion of the layer 126' are being lifted off because of removal of the second NiFe layer 122'. This lift-off may be facilitated by the physical action of the lift-off mechanism. The layer 120' may be partially removed by the first etch process. The first Ru 118 is exposed. In some embodiments, the lift-off mechanism may also aid in removal of the first Ru layer 118.

Figure 6:
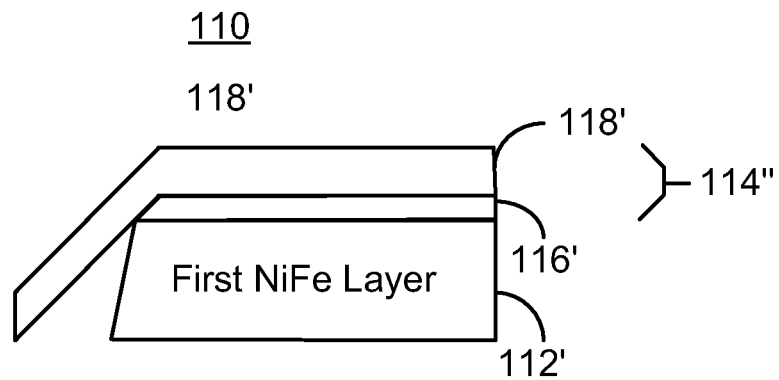

FIG. 6 depicts the AFM seed structure 110 after step 102 is completed. Thus, the second NiFe 122' has been removed by the first etchant combination. Although the second multilayer 124' has been removed, this is believed to be accomplished through a combination of chemical etching by the etch bath and lift-off. Portions of the first Ru layer 118' of the first multilayer 114" remain. In some embodiments, a portion of the underlying first NiFe layer 112' has been removed in step 102. A portion of the layer 116' may also be removed. As a result, the first Ru layer 118' of the multilayer 114" may collapse at the edges, covering the underlying NiFe layer 112'. Thus, the Ru layer 118' may be considered to have flakes at its edges.

Figure 7:
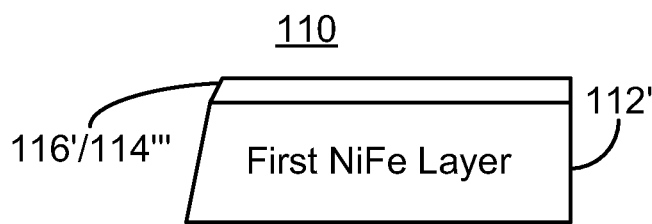

A remaining portion of the first Ru layer 118' is removed using a second wet etch process, via step 104. The second wet etch uses a second etchant combination configured to remove Ru. This second etchant combination may use an etch bath including nitric acid and ceric ammonium nitrate. In some embodiments, step 104 include applying a lift-off mechanism in connection with the etch bath. Thus, an extended time, increased agitation speed, application of ultrasound, and/or high pressure spray may be utilized. However, in other embodiments, step 104 may be performed in another manner. FIG. 7 depicts the AFM seed structure 110 after step 104 is performed. Thus the layer 116 of the first multilayer 114" may remain. However, in other embodiments, some or all of the layer 116 may be removed. Similarly, the layer first NiFe layer 112 may not be etched at all or a portion of the layer 112 may have been removed by step 102 and/or 104.

A remaining portion of the first multilayer 114''' and the first NiFe layer 112 are removed using a third etch process, via step 106. The third etch process uses a third etchant combination configured to remove at least the NiFe in the first NiFe layer. In some embodiments the third etchant combination is configured to remove the NiFe and CoFe. This may be particularly useful if the layer 116' is CoFe. In some embodiments, the third etchant combination includes an etch bath including sulfuric acid, hydrochloric acid, and hydrogen peroxide. In some embodiments, the etch bath of step 106 may be the same as the second etch bath of step 102. In addition, an HCl or other bath used to remove oxides may also be added. Further, the etch bath(s) of step 106 may be combined with one or more of the lift-off mechanisms described above.

Using the method 100, the AFM seed structure 110 may be removed. As a result, the AFM seed structure 110 may be used in fabricating components while ensuring unwanted sections of the AFM seed structure can be removed. Thus, performance of the magnetic structures formed using the AFM seed structure 110 can be enhanced without compromising performance of the device. Performance of devices such as magnetic recording transducers may thus be improved.

Figure 8:
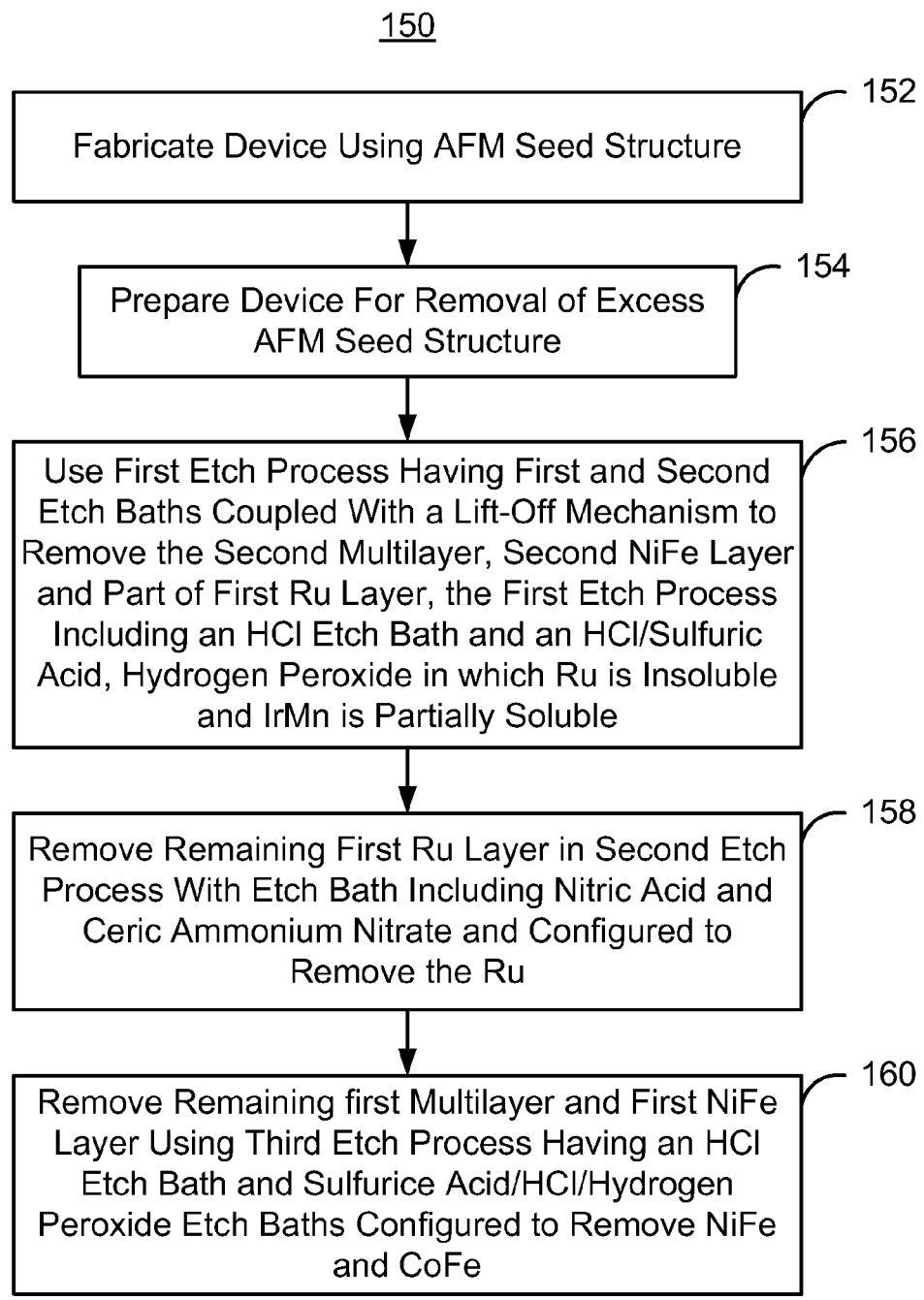
FIG. 8 depicts an exemplary embodiment of a method for removing an antiferromagnetic seed structure.

FIG. 8 depicts an exemplary embodiment of a method 150 for fabricating a transducer using an AFM seed structure that has been used in fabricating a portion of a magnetic transducer. For simplicity, some steps may be omitted, combined, and/or interleaved. The method 150 also may commence after formation of other structures of the read and/or write transducer. FIGS. 9-12 depict an exemplary embodiment of an magnetic recording transducer 200 removed using the method 150. For clarity, FIGS. 9-12 are not to scale. The method 150 is also described in the context of the transducer 200 depicted in FIGS. 9-12. However, the method 150 may be used to fabricate multiple structures and/or transducer at substantially the same time. The method 150 and transducer 200 are also described in the context of particular layers. However, in some embodiments, such layers may include sub-layer(s).

Figure 9:
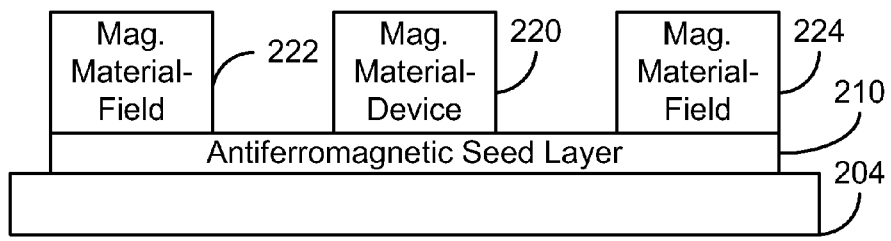
FIGS. 9-12 depict an exemplary embodiment of an antiferromagnetic seed structure.
Figure 10:
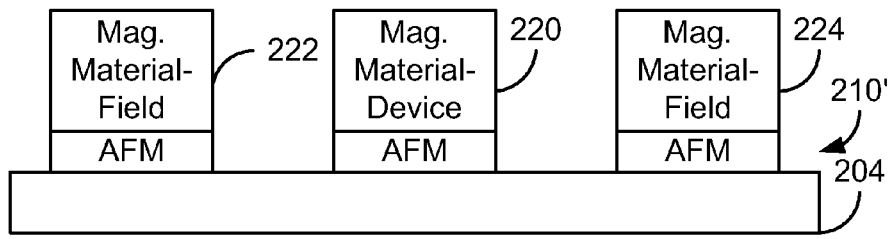

Desired portions of the device are fabricated using an AFM seed structure, via step 152. For example, the AFM seed structure may be blanket deposited across a desired region of the substrate, potentially on other layers. The AFM seed structure may reside both in the device regions and the field regions of the transducers. The corresponding structures, such as poles and/or shields, may be fabricated. FIG. 9 depicts the transducer during step 102. Thus, the AFM seed structure 210 has been deposited on the underlying substrates. The AFM seed structure 210 is analogous to the AFM seed structure 110. Thus, analogous layers including the first and second NiFe layers and Ru layers are included in the AFM seed structure 210. The magnetic materials 220 for a device such as a pole have been provided in the device region. Further, magnetic materials 222 and 224 have also been provided in the field regions. FIG. 10 depicts the transducer 200 after step 202 has been performed. The exposed portions of the AFM seed structure 210 have been removed, for example via ion milling. Thus, the magnetic materials 220 for the device being fabricated as well as the materials 222 and 224 remain. The portions of the AFM seed structure 210' under these regions also remain.

Figure 11:
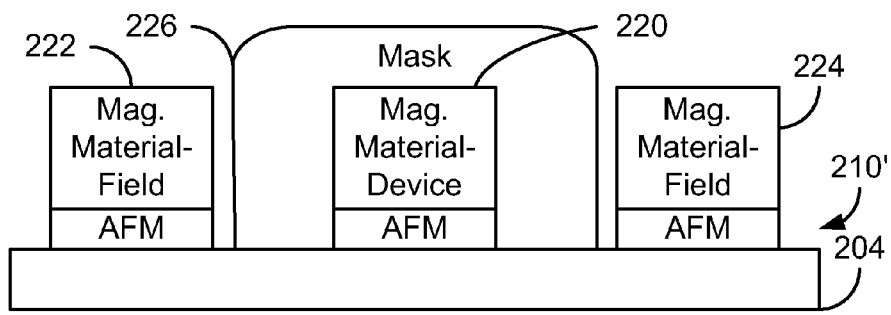

The transducer 200 is prepared for removal of the AFM seed structure 210 and portions of the magnetic materials 222 and 224, via step 154. In some embodiments, step 154 includes providing a mask that covers the portion of the transducer 200 desired to be preserved. For example, a photoresist mask that covers the device region may be provided using photolithography. FIG. 11 depicts the transducer 200 after step 154 has been performed. As a result, a photoresist mask 226 has been provided. The mask 226 covers the portion of the magnetic material 220 and AFM seed structure 210' in the device region, but exposes portions of the magnetic material 222 and 224 and underlying AFM seed structure 210'' in the field regions.

At least the second multilayer, the second NiFe layer and at least a portion of the first Ru layer in the AFM seed structure 210 are removed using a first wet etch process, via step 156. The first wet etch process uses a first etchant combination that is configured to remove at least NiFe. In such embodiments, the first etchant combination removes not only the portions of the seed structure 210', but also the magnetic materials 222 and 224. For example, the first etchant combination may be configured to remove NiFe, CoNiFe, and CoFe. The wet etch process of step 156 does not remove the Ru by dissolving the Ru. Instead, at least the second Ru layer and IrMn layer are removed at least partially through lift-off due to etching of the second NiFe layer in the AFM seed structure 210'.

In this embodiment, the first etchant combination includes two etch baths as well as lift-off mechanism(s). Thus, the substrate including the AFM seed structure 210' is immersed in the etch bath(s) while the lift-off mechanism is applied. The first etch bath includes at least nine and not more than eleven volume percent hydrochloric acid. The second etch bath includes at least five and not more than seven volume percent hydrochloric acid, at least ten and not more than twelve volume percent sulfuric acid, and at least nine and not more than eleven volume percent hydrogen peroxide. One or more of the lift-off mechanisms described above are also combined with at least the second etch bath in step 156.

A remaining portion of the first Ru layer of the AFM seed structure 210' in the field regions is removed using a second wet etch process, via step 158. The second wet etch uses an etch bath including nitric acid and ceric ammonium nitrate. In some embodiments, step 158 include applying one or more of the lift-off mechanisms described above in connection with the etch bath.

Figure 12:
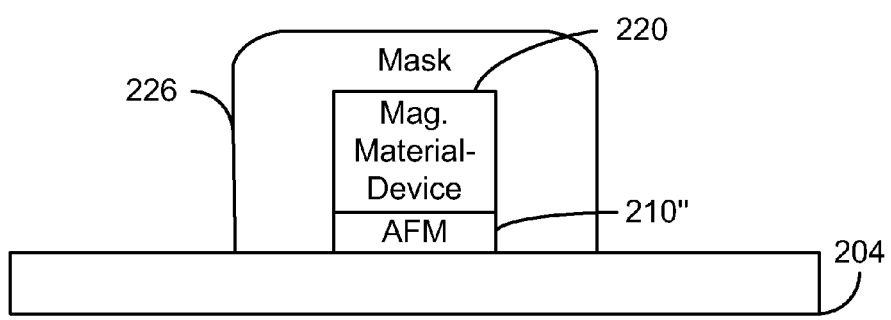

A remaining portion of the first multilayer and the first NiFe layer for the exposed AFM seed structure 210' are removed using a third etch process, via step 160. The third etch process uses a third etchant combination includes an etch bath including sulfuric acid, hydrochloric acid, and hydrogen peroxide. Further, the etch bath(s) of step 160 may be combined with one or more of the lift-off mechanisms described above. FIG. 12 depicts the transducer 200 after step 160 has been performed. The exposed portions of the magnetic material and AFM seed structure 210' have been removed.

Using the method 150, the AFM seed structure 210' may be removed from the desired regions. As a result, the AFM seed structure 210 may be used in fabricating components 220 while ensuring unwanted sections of the AFM seed structure can be removed. Thus, performance of the magnetic structures 220 formed using the AFM seed structure 210 can be enhanced without compromising performance of the device 200. Performance of devices such as magnetic recording transducers may thus be improved.

We claim:

1. A method for fabricating a transducer including an antiferromagnetic seed structure, the antiferromagnetic seed structure including a first NiFe layer, a first multilayer including a first Ru layer, a second NiFe layer, a second multilayer including a second Ru layer on the second NiFe layer, the first multilayer residing between the first NiFe layer and the second NiFe layer, the method comprising:

removing at least the second multilayer, the second NiFe layer and at least a portion of the first Ru layer using a first wet etch process, the first wet etch process using a first etchant combination configured to remove at least NiFe and in which Ru is insoluble, at least the second Ru layer being removed through lift-off due to etching of the second NiFe layer;

removing a remaining portion of the first Ru layer using a second wet etch process, the second wet etch process using a second etchant combination configured to remove Ru; and removing a remaining portion of the first multilayer and the first NiFe layer using a third etch process, the third etch process using a third etchant combination configured to remove at least the NiFe.

2. The method of claim 1 wherein the second multilayer includes an IrMn layer and a third NiFe layer, the second Ru layer residing between the IrMn layer and the third NiFe layer.

3. The method of claim 2 wherein the IrMn layer is partially soluble in the first etchant combination and wherein a first portion of the IrMn layer is soluble in the first etchant combination and a second portion of the IrMn layer is removed through the lift-off of the second NiFe layer.

4. The method of claim 1 wherein the first multilayer includes a first CoFe layer and a second CoFe layer, the first Ru layer residing between the first CoFe layer and the second CoFe layer.

5. The method of claim 4 wherein the third etchant combination is configured to remove the NiFe and CoFe.

6. The method of claim 5 wherein the third etchant combination includes an etch bath including sulfuric acid, hydrochloric acid, and hydrogen peroxide.

7. The method of claim 1 wherein the second etchant combination includes an etch bath including nitric acid and ceric ammonium nitrate.

8. The method of claim 1 wherein magnetic materials reside on the antiferromagnetic seed structure and wherein the first etchant combination is configured to remove the magnetic materials and the second NiFe layer.

9. The method of claim 8 wherein the first etchant combination is configured to remove the NiFe, CoNiFe, and CoFe.

10. The method of claim 9 wherein the first etchant combination includes at least one etch bath including sulfuric acid, hydrochloric acid, and hydrogen peroxide.

11. The method of claim 10 wherein the first etchant combination includes a first etch bath and a second etch bath, the first etch bath including at least five and not more than fifteen volume percent hydrochloric acid, the second etch bath including at least three and not more than eleven volume percent hydrochloric acid, at least six and not more than fifteen volume percent sulfuric acid, and at least five and not more than fifteen volume percent hydrogen peroxide.

12. The method of claim 11 wherein the first etch bath including at least nine and not more than eleven volume percent hydrochloric acid, and wherein the second etch bath including at least five and not more than seven volume percent hydrochloric acid, at least ten and not more than twelve volume percent sulfuric acid, and at least nine and not more than eleven volume percent hydrogen peroxide.

13. The method of claim 8 wherein the first etchant combination includes at least one etch bath and applying a lift-off mechanism.

14. The method of claim 13 wherein the lift-off mechanism includes at least one of an etch time in the at least one etch bath of at least two minutes, agitating the at least one etch bath, applying ultrasound to the at least one etch bath and applying at least one high pressure spray.

15. The method of claim 14 wherein the agitating the at least one etch bath includes providing an agitation speed of at least 15 mm/s.

16. The method of claim 15 wherein the agitation speed is at least 50 mm/s.

17. The method of claim 1 wherein the remaining portion of the first Ru layer includes a plurality of Ru flakes.

18. A method for fabricating a transducer on a substrate having a device region and a field region, the device region and the field region each including an antiferromagnetic seed structure and magnetic materials residing on the antiferromagnetic seed structure, the antiferromagnetic seed structure including a first NiFe layer, a first multilayer, a second NiFe layer, and a second multilayer, the first multilayer including a first CoFe layer, a second CoFe layer and a first Ru layer between the first CoFe layer and the second CoFe layer, the first multilayer residing between the first NiFe layer and the second NiFe layer, the second multilayer including an IrMn layer, a third NiFe layer, and a second Ru layer between the third NiFe layer and the IrMn layer, the second multilayer residing on the second NiFe layer, the method comprising:

removing at least the second multilayer, the second NiFe layer and at least a portion of the first Ru layer using a first wet etch process, the first wet etch process using a first etchant combination including a first etch bath, a second etch bath, and at least one lift-off mechanism coupled with at least one of the first etch bath and the second etch bath, Ru being insoluble in the first etchant combination, IrMn being partially soluble in the first etchant combination, the first etchant combination being configured to remove NiFe, CoFe, and CoNiFe, the first etch bath including at least nine and not more than eleven volume percent hydrochloric acid, the second etch bath including at least five and not more than seven volume percent hydrochloric acid, at least ten and not more than twelve volume percent sulfuric acid, and at least nine and not more than eleven volume percent hydrogen peroxide, the at least one lift-off mechanism including at least one of an etch time in the second etch bath of at least three minutes, agitating at least the second etch bath at an agitation speed of at least 50 mm/s, applying ultrasound to at least the second etch bath and applying at least one high pressure spray, at least the second Ru layer and at least a portion of the IrMn layer being removed through lift-off due to etching of the second NiFe layer;

removing a remaining portion of the first Ru layer using a second wet etch process, the second wet etch process configured to remove Ru and including nitric acid and ceric ammonium nitrate;

removing a remaining portion of the first multilayer and the first NiFe layer using a third etch process, the third etch process configured to remove the NiFe and the CoFe and including sulfuric acid, hydrochloric acid, and hydrogen peroxide.

* * * * *